United States Patent
Wohlgemuth

(10) Patent No.: US 11,868,120 B2
(45) Date of Patent: Jan. 9, 2024

(54) METHOD FOR REDUCING A VOLUME OF DATA TO BE TRANSMITTED FROM A FIELD DEVICE

(71) Applicant: Endress+Hauser Process Solutions AG, Reinach (CH)

(72) Inventor: Markus Wohlgemuth, Erschwil (CH)

(73) Assignee: Endress+Hauser Process Solutions AG, Reinach (CH)

( * ) Notice: Subject to any disclaimer, the term of this patent is extended or adjusted under 35 U.S.C. 154(b) by 630 days.

(21) Appl. No.: 17/052,746

(22) PCT Filed: Apr. 11, 2019

(86) PCT No.: PCT/EP2019/059257
§ 371 (c)(1),
(2) Date: Nov. 3, 2020

(87) PCT Pub. No.: WO2019/211075
PCT Pub. Date: Nov. 7, 2019

(65) Prior Publication Data
US 2021/0181725 A1    Jun. 17, 2021

(30) Foreign Application Priority Data
May 3, 2018 (DE) ............... 10 2018 110 552.5

(51) Int. Cl.
*G05B 19/418* (2006.01)
*G16Y 30/00* (2020.01)
(Continued)

(52) U.S. Cl.
CPC ... *G05B 19/41855* (2013.01); *G05B 19/4183* (2013.01); *G16Y 30/00* (2020.01); *G16Y 40/35* (2020.01); *H04W 84/18* (2013.01)

(58) Field of Classification Search
CPC ............................................... G05B 19/41855
See application file for complete search history.

(56) References Cited

U.S. PATENT DOCUMENTS 9,071,257 B2   6/2015   Patil et al.
10,618,726 B2*  4/2020   Wahl ............... H04L 67/12
(Continued)

FOREIGN PATENT DOCUMENTS

DE        10209734 A1    9/2003
DE    102009039097 B3   11/2010
DE    102014102660 A1    9/2014

OTHER PUBLICATIONS

Miśkowicz, Marek, Efficiency of Level-Crossing Sampling for Bandlimited Gaussian Random Processes, IEEE, 6 pp. (137-142).
(Continued)

*Primary Examiner* — Nathan L Laughlin
(74) *Attorney, Agent, or Firm* — Mark A. Logan; Endress+Hauser (USA) Holding, Inc.

(57) ABSTRACT

Disclosed is a method for reducing volume of data transmitted from a field device. The method includes checking a value of a process variable at a first point in time and comparing the value with a value checked at a second point in time preceding the first point in time. The value at the first point in time is transmitted only when it differs from the value at the second point in time by a predetermined first magnitude. Additionally, the value at the first point in time is transmitted only when the difference between the value at the first point in time and the value at the second point in time differ by a predetermined factor from a difference between the value at the second point in time and a value at a third point in time preceding the second point in time.

5 Claims, 6 Drawing Sheets

(51) Int. Cl.
*G16Y 40/35* (2020.01)
*H04W 84/18* (2009.01)

(56) References Cited

U.S. PATENT DOCUMENTS

| | | | | |
|---|---|---|---|---|
| 2008/0017726 A1* | 1/2008 | Neumann | ............... | G01D 21/00 |
| | | | | 237/2 A |
| 2008/0291006 A1* | 11/2008 | Kang | ..................... | G08B 25/10 |
| | | | | 340/539.1 |
| 2013/0317659 A1* | 11/2013 | Thomas | ............ | H04W 52/0219 |
| | | | | 700/286 |
| 2014/0180140 A1 | 6/2014 | Alpert | | |
| 2015/0134801 A1* | 5/2015 | Walley | .................... | H04L 43/50 |
| | | | | 709/223 |

OTHER PUBLICATIONS

Rieger, Robert and Chen, Shinyu, A Signal Based Clocking Scheme for A/D Converters in Body Sensor Networks, IEEE, 4 pp.
Liu, Chong, Wu, Kaui and Pei, Jian, An Energy-Efficient Data Collection Framework for Wireless Sensor Networks by Exploiting Spatiotemporal Correlation, IEEE Transactions on Parallel and Distributed Systems, vol. 18, No. 7, Jul. 2007, 14 pp. (1010-1023).

\* cited by examiner

METHOD FOR REDUCING A VOLUME OF DATA TO BE TRANSMITTED FROM A FIELD DEVICE

CROSS-REFERENCE TO RELATED APPLICATIONS

The present application is related to and claims the priority benefit of German Patent Application No. 10 2018 110 552.5, filed on May 3, 2018 and International Patent Application No. PCT/EP2019/059257, filed on Apr. 11, 2019, the entire contents of which are incorporated herein by reference.

TECHNICAL FIELD

The invention relates to a method for reducing volume of data to be transmitted from a field device.

BACKGROUND

Already known in the state of the art are field devices used in industrial plants. In automation technology, as well as in manufacturing automation, field devices are often applied. Referred to as field devices are, in principle, all devices, which are applied near to the process and which deliver, or process, process relevant information. Field devices are used for registering and/or influencing process variables. Sensor units serve for registering process variables. Such are used, for example, for pressure- and temperature measurement, conductivity measurement, flow measurement, pH measurement, fill level measurement, etc. and register the corresponding process variables, pressure, temperature, conductivity, pH value, fill level, flow, etc. Used for influencing process variables are actuator systems. Such are, for example, pumps or valves, which can influence the flow of a liquid in a tube or the fill level in a container. Besides the above mentioned measuring devices and actuators, referred to as field devices are also remote I/Os, radio adapters, and, in general, devices, which are arranged at the field level.

In modern industrial plants, field devices are, as a rule, connected with superordinated units via communication networks, such as, for example, fieldbusses (Profibus®, Foundation® Fieldbus, HART®, etc.). The superordinated units are control units, such as, for example, a PLC (programmable logic controller), a PCS (process control system) or a cloud (a database reachable via the Internet). Superordinated units serve, among other things, for process control, data storage and data evaluation, as well as for start-up of field devices. The measured values registered by field devices, especially their sensor units, are transmitted via their bus system to one or more superordinated units, which, in given cases, process the measured values further and forward them to the control station or other systems of the plant. The control station and other systems serve for process visualizing, process monitoring, process optimizing, maintenance, data analysis and process control via the superordinated units. In addition, also a data transmission from the superordinated unit via the bus system to the field devices is required, especially for configuration and parametering of field devices as well as for operation of actuators.

In the process industry, in the context of moving to digital technologies and with the trend toward the "Industrial Internet of Things" (IIoT), always more field devices, and their sensors, are required, often at movable and/or difficultly accessible locations. The data of these field devices are, consequently, often transmitted wirelessly. Ideally, such field devices are supplied via autarkic energy sources with the electrical energy required for operation. For electrical current supply, finite energy sources, such as, for example, batteries, or at least temporarily continuous energy sources, such as solar cells or the so-called "Energy Harvesting" are used. For autarkic operation of a field device, the energy required by its sensor and for transmitting obtained process values is decisive. A significant goal, in such case, is to minimize the electrical energy required by the field device.

In the case of a wireless data transmission (e.g. using the wireless industrial protocol, wireless HART), the required electrical energy depends directly on the data rate. If a value of a process variable is to be transmitted every minute, this requires significantly more energy, than when the value of the process variable is transmitted, for example, only each hour or once per day. In the case of a constant, low, transmission rate (e.g. once per hour), however, as a rule, information is lost, since it is not known how the process variable has behaved between the two transmissions (and between the two obtained values). The receiver of the transmitted data does not have sufficient information to be able to show how the process variable behaved in the interim. A simple linear interpolation of the data points in the case of a low transmission rate is, in given cases, insufficient.

If the data transmission rate is set constantly high (for example, at one transmission per minute), then this requires in the case of a durably constant process value an unjustifiable amount of energy for always just re-transmitting the same value of the process variable. On the other hand, the receiver of the transmitted data is in the case of a high transmission rate then always able to document a change of the process variable with good resolution.

If the data transmission rate is set constantly low (for example, at one transmission per hour), then in the case of a durably constant process variable relatively little energy is required for transmitting the constant value. However, the receiver of the transmitted data is then burdened with poor resolution for documenting a change of the process variable.

Especially for processes, or process variables, in the case of which the value is quite constant for an extended length of time and then can change relatively rapidly, a constant data transmission rate is disadvantageous.

Known in the state of the art are methods, with which the volume of data to be transmitted from a field device can be adapted. Known from DE 102 09 734 A1, for example, is to establish transmission points in time. At a transmission point in time, it is checked whether the process variable value currently collected for the transmission point in time differs from the value of the process variable collected at the preceding transmission point in time. Only when the current value of the process variable differs by a predetermined value from the preceding value of the process variable is the current value of the process variable transmitted at the transmission point in time. However, it can happen in application of this method that more data is transmitted—and, thus, more energy consumed—than would be necessary for a reliable replication of a measurement curve by the receiver of the transmitted data.

SUMMARY

Based on the above, an object of the invention is to provide a method, which enables minimizing the energy required for data transmission of values of a process variable with a variable transmission rate, without losing information regarding the behavior of the values of the process variable.

The object is achieved by a method for reducing volume of data to be transmitted from a field device, wherein the field device registers values of at least one process variable, wherein the field device is connected for communication with a network participant via a communication network and is embodied to transmit registered values of the process variable to the network participant, wherein at determined points in time, which have especially a constant time difference from neighboring points in time, a checking of the current value of the process variable occurs, wherein, in the course of checking, a value of the process variable at a first point in time, which corresponds to the point in time of the checking, is compared with the value of the process variable at a second point in time, wherein the second point in time is the point in time preceding the first point in time, and wherein the value of the process variable at the first point in time is only transmitted, when the magnitude of the difference between the value of the process variable at the first point in time and the value of the process variable at the second point in time is greater than or equal to a predetermined first magnitude. According to the invention, the value of the process variable at the first point in time is only transmitted, when, supplementally, the magnitude of the difference between the value of the process variable at the first point in time and the value of the process variable at the second point in time differs at least by a predetermined factor from a magnitude of a difference between the value of the process variable at the second point in time and a value of the process variable at a third point in time, which is the point in time preceding the second point in time.

A significant advantage of the method of the invention is that the volume of data to be transmitted from a field device can be further reduced. In this way, the lifetime of a finite energy source is increased, or the energy requirement of a continuous energy source optimized. The volume of data to be transmitted can, compared with the known method of the state of the art, be further reduced by calculating a slope of a measured value rise, or measured value fall. For this, the difference between two values of the process variable is formed. Then, the current value of the process variable at the following point in time is obtained and the slope relative to the value of the process variable at the preceding point in time calculated. If these two slopes are approximately equal, or if these slopes deviate from one another by no more than a predetermined value, then the current value of the process variable is not transmitted. At following points in time, these methods steps are repeated, until the slopes deviate from one another by greater than the predetermined value and then the current value of the process variable is transmitted. In this way, the receiver of the transmitted data, thus, the transmitted values of the process variable, has that information required in order to be able to replicate the progress of the process variable with sufficiently high accuracy. In this way, maximum information concerning the progress of the process variable is possible with minimum energy consumption for the data transmission.

If the value of the process variable remains constant over a defined time period, then it can be provided after passage of this period of time to transmit the current value of the process variable at the next determined point in time. In this way, a user can know that the field device is still functional, and the energy source is not worn-out, or malfunctioning.

Examples of field devices, which can be used in connection with the method of the invention, have already been indicated in the introductory portion of the description.

In an advantageous, further development of the method of the invention, it is provided that when the magnitude of the difference between the value of the process variable at the first point in time and the value of the process variable at the second point in time is greater than or equal to a predetermined second magnitude, wherein the second magnitude is greater than the first magnitude, supplementally, the value of the process variable at the second point in time is transmitted. In this way, the progress of the process variable can also be reliably replicated by the receiver of the transmitted data in the case of an abrupt rise, or an abrupt fall, of the process variable.

In a preferred embodiment of the method of the invention, it is provided that each value of the process variable is accompanied by a time stamp, wherein each time stamp corresponds to a point in time of the checking.

In an advantageous, further development of the method of the invention, it is provided that the field device stores the time stamp accompanied values of the process variable as historical data and wherein the field device determines the first magnitude and/or the second magnitude and/or the factor based on the historical data. Based on a steadily growing history, the field device can independently determine the relevant values optimal for its application, without necessitating active input from the user. For comparing the historical values and determining the first magnitude, second magnitude and/or the factor, for example, an AI (artificial intelligence) algorithm is used, especially one based on neural networks.

In a preferred embodiment of the method of the invention, it is provided that a wireless network is used as communication network, wherein the values of the process variable are transmitted wirelessly from the field device to the additional network participants.

BRIEF DESCRIPTION OF THE DRAWINGS

The invention will now be explained in greater detail based on the appended drawing, the figures of which show as follows:

FIG. 5 FIGS. 5a and 5b show a first approach to a solution according to the present disclosure;

FIG. 6 FIGS. 6a and 6b show a second approach to a solution according to the present disclosure; and FIG. 7 FIGS. 7a and 7b show a summarizing example of an embodiment of the method of the present disclosure.

DETAILED DESCRIPTION

Figure 1:
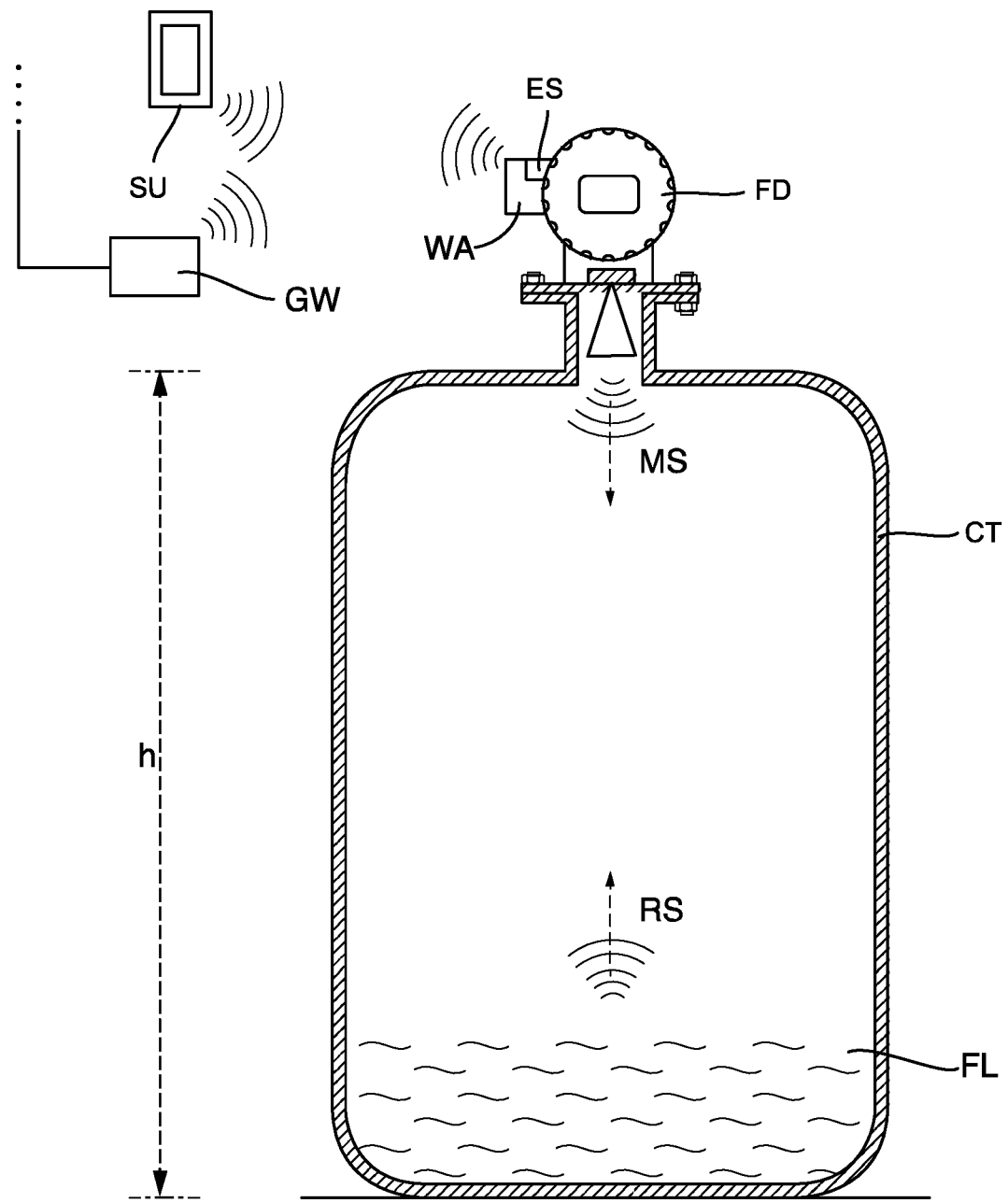
FIG. 1 shows an application of a field device of automation technology, in which the method of the present disclosure is used.

FIG. 1 shows a container CT, which is applied in a plant of process automation and on which a field device FD is mounted. Accommodated in the container is a fill substance FL, which in this example of an embodiment is salt. The fill substance FL can, however, alternatively be any fluid-like medium or bulk good. For monitoring the fill height h of the fill substance FL in the container CT, a field device FD in the form of a contactless fill height measuring device is mounted on the container CT. The field device measures the fill height h of the fill substance FL by emitting a measuring signal MS. The measuring signal MS is reflected on the surface of the fill substance FL. The reflected signal RS is received and processed by the field device FD. Based on characteristic variables of the reflected signal RS, for example, based on the time between the emitting of the measuring signal MS and the receiving of the reflected signal RS, the fill height h of the fill substance FL can be determined as process variable. The field device obtains the current values of the process variable h in a determined measuring rate.

The field device has an autarkic energy source ES, which supplies the field device FD with electrical energy needed for its operation. The energy source ES in the present example of an embodiment is a battery. The energy source ES can, alternatively, however, also be a continuous energy source, such as, for example, a solar cell.

Furthermore, the field device FD includes a wireless, or radio, adapter WA. The radio adapter WA is likewise supplied by the energy source ES with the electrical energy needed for its operation. The radio adapter is embodied to check, e.g. to query, the most recent value of the process variable h obtained by the field device FD and to transmit such wirelessly. In such case, especially the wireless HART protocol is used. The transmitted value of the process variable h is then received by an additional network participant. The additional network participant is, for example, a service unit SU, which independently processes the received value of the process variable, or a gateway GW, which forwards the received value of the process variable, for example, to the control station of the plant. In general, it can be assumed that operation of the radio, or wireless, adapter requires essentially more electrical energy than is required for measurement operation of the field device FD. The transmission rate of the radio, or wireless, adapter WA (which in all cases is less than the measuring rate of the field device FD) must, consequently, be selected in such a way that a good compromise is achieved between the volume of data transmitted per unit time and the amount of energy required thereby.

Figure 2A:
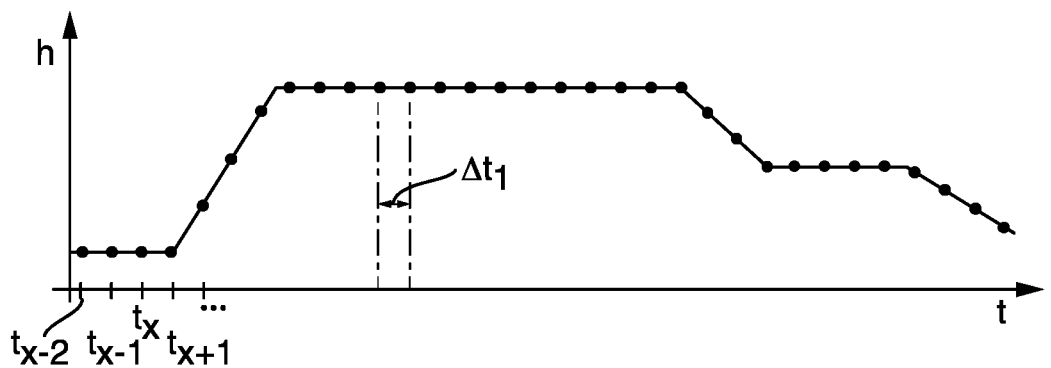
FIGS. 2a and 2b show a first illustration of the basic problem solved by the method of the present disclosure.
Figure 2B:
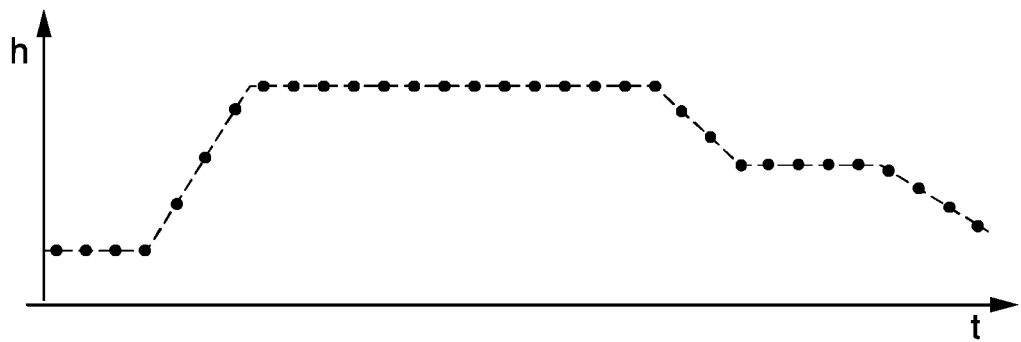

FIGS. 2a and 2b illustrate the basic problem, which is present in the fashioning of this compromise and which underlies the method of the invention. Shown in FIG. 2a as a function of time is the process variable h. At the determined points in time $t_{x-1}$, $t_x$, $t_{x+1}$, $t_{x+2}$, etc., each of which is spaced from its neighbors by the fixed time interval $\Delta t_1$, the radio adapter queries the current value of the process variable h and transmits such per radio to the additional network participants SU, GW. The time interval $\Delta t_1$ is selected in this example to be short and amounts, for example, to 1 minute.

Shown in FIG. 2b are the values of the process variable h received by the network participants SU, GW. By stepwise linear interpolating the individual received values, the progress of the process variable can be replicated with a high degree of reliability. The replicated curve differs only insignificantly from the actual curve of the process variable h shown in FIG. 2a. However, due to the frequent data transfer there is a high energy requirement, so that the energy source ES of the field device FD and wireless adapter WA can, in given cases, only supply for a short period of time.

Figure 3A:
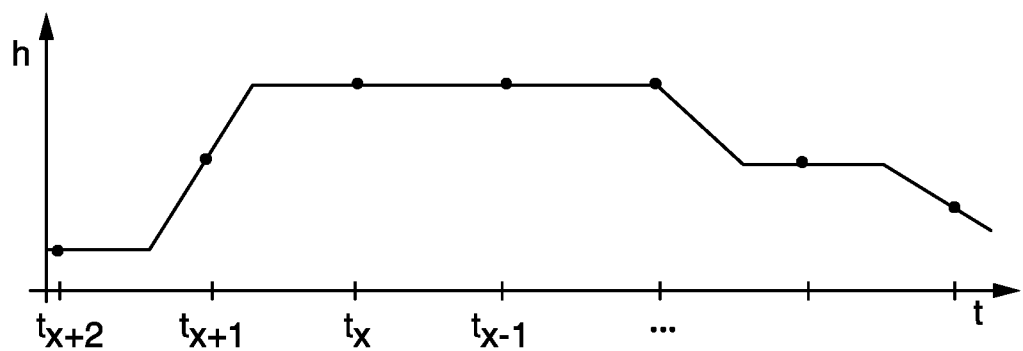
FIGS. 3a and 3b show a second illustration of the basic problem solved by the method of the present disclosure.
Figure 3B:
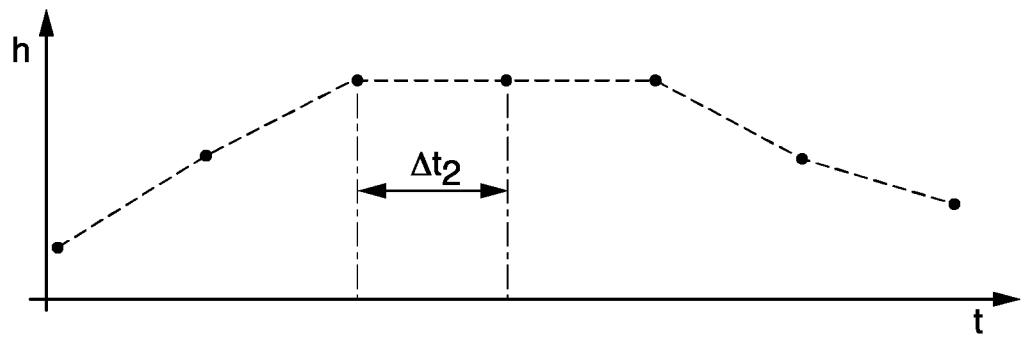

FIGS. 3a and 3b show an additional aspect of the basic problem. Shown in FIG. 3a as a function of time is the process variable h. At determined points in time $t_{x-1}$, $t_x$, $t_{x+1}$, $t_{x+2}$, etc., each of which lies spaced from one another by the fixed time interval $\Delta t_2$, the radio adapter queries the current value of the process variable h and transmits such per radio to the additional network participants SU, GW. The time interval $\Delta t_2$ in this example is long and amounts, for example, to 1 hour.

Shown in FIG. 3b are the values of the process variable h received by the network participants SU, GW. Through stepwise linear interpolating of the individual received values, the progress of the process variable can, however, only be poorly replicated. The replicated curve differs very substantially from the actual course of the process variable h shown in FIG. 3a. However, due to the less frequent data transfer, there is a lower energy requirement than in the example described in FIGS. 2a and 2b, so that the energy source ES of the field device FD, or the radio adapter WA, can, in given cases, supply for a longer time period.

Figure 4A:
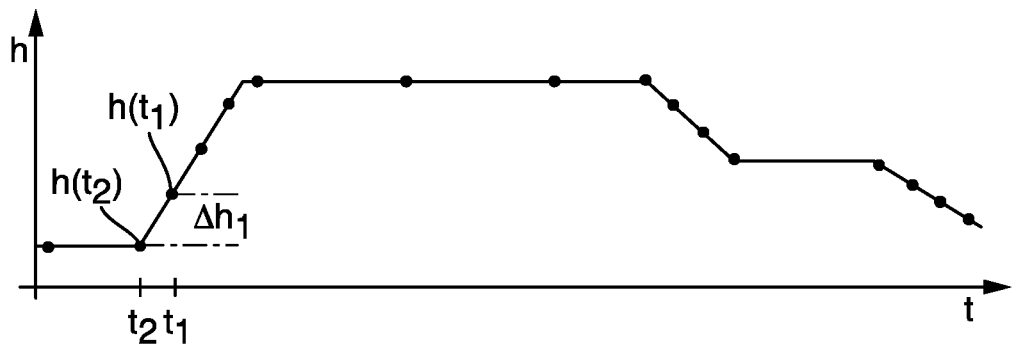
FIGS. 4a and 4b show an approach to a solution, such as described in the state of the art.
Figure 4B:
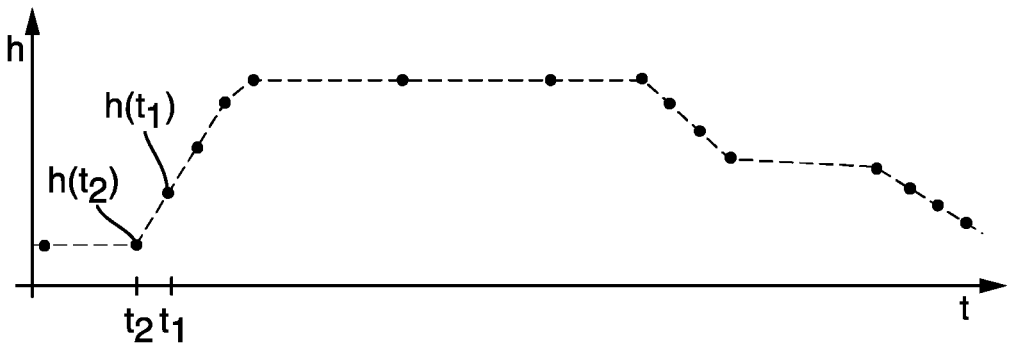

FIGS. 4a and 4b show an approach to a solution, such as described in the state of the art, for example, in DE 102 09 734 A1. FIG. 4a shows, in such case, the real measurement curve of the process variable h with the points in time, at which the values are transmitted. FIG. 4b shows a measurement curve of the received values of the process variable h replicated by means of interpolation.

Also in this example, the values of the process variable h at determined points in time are downloaded. Then, it is, however, calculated, whether a change of the values of the process variable h has occurred between two points in time. Only when a change is greater than or equal to a predetermined value, is the current value of the process variable h transmitted.

For example, the value $h(t_1)$ is obtained at point in time $t_1$. Then, the magnitude of the difference $h(t_1)-h(t_2)$ is formed with the value $h(t_2)$. In such case, such magnitude is greater than a predetermined magnitude $\Delta h_1$, so that the value $h(t_1)$ is transmitted.

In case no, or an insufficiently significant, change occurs, a value is not transmitted. Thus, energy can be saved. However, it can occur in application of such known methods of the state of the art that more values are transmitted—and, thus, more energy consumed—than would be necessary for reliable replicating of the progress of the process variable h in the network participants SU, GW. Also, sudden jumps, so-called spikes, of the process variable h can only be insufficiently transmitted.

Figure 5A:
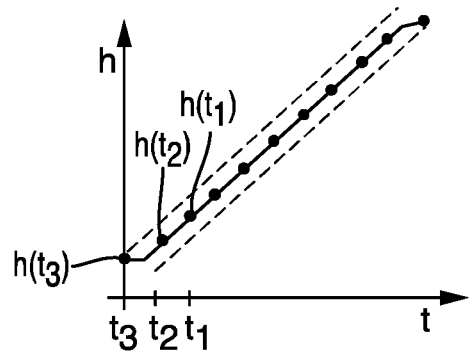
Figure 5B:
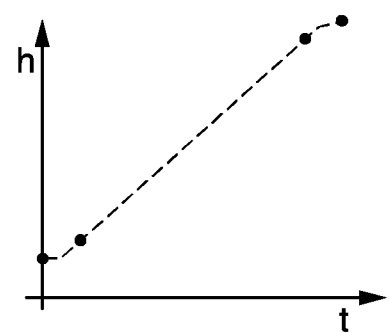

FIGS. 5a and 5b show a first approach of the invention for solving this problem. In addition to forming the magnitude of the difference between two values and comparing with a predetermined magnitude, a value of the process variable h is only transmitted, when this magnitude of the difference differs from the magnitude of the difference between the two preceding points in time by a predetermined factor. In other words, only when a significant change of the slope occurs, is a value of the process variable transmitted. In the present example, energy can, thus, be saved in the case of slow, continuous fillings of the container CT.

FIG. 5a shows the real curve of the process variable h. The measured value $h(t_2)$ at the point in time $t_2$ is transmitted, since this differs by more than a predetermined magnitude from the measured value $(ht_3)$. The same testing occurs at the point in time $t_1$. The magnitude of the difference $h(t_1)-h(t_2)$ is formed and compared with the magnitude of the difference $h(t_2)-h(t_3)$. In the present case, these magnitudes, or slopes, scarcely differ; consequently, the value $h(t_1)$ is not transmitted. Only at the point in time $t_x$ does the slope change, such that the value $h(t_x)$ is transmitted.

As shown in FIG. 5b, the curve for the process variable h can, in spite of reducing the transmitted values, be well replicated by stepwise linear interpolation.

Figure 6A:
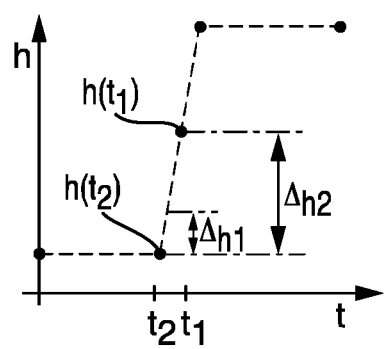
Figure 6B:
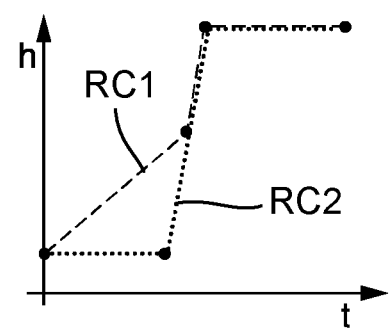

FIGS. 6a and 6b show a second approach of the invention for solving the problem. The second approach can be combined with the first approach of FIGS. 5a and 5b. Analogously to the procedure described in FIGS. 4a and 4b, also here the magnitude of the difference between two values is formed and compared with a predetermined magnitude $\Delta h_1$ and a value of the process variable h transmitted, depending on the result of the comparison. If the magnitude of the difference supplementally exceeds a predetermined magnitude $\Delta h_2$, wherein $\Delta h_2 > \Delta h_1$, then the value of the process variable h of the preceding point in time is likewise transmitted.

As an example of such, FIG. 6a shows the real curve of the process variable h. The value $h(t_1)$ is obtained at the point in time $t_1$. Then, the magnitude of the difference $h(t_1)-h(t_2)$ is formed with the value $h(t_2)$. In such case, such magnitude is greater than a predetermined magnitude $\Delta h_1$, so that the value $h(t_1)$ is transmitted. Moreover, this magnitude is greater than a predetermined magnitude $\Delta h_2$, so that supplementally the value $h(t_2)$ is transmitted.

Shown in FIG. 6b are two replicated curves RC1, RC2 of the process variable h. The first curve RC1 was formed using a transmission of the values of the process variable h according to the previously known method (see FIGS. 4a and 4b). In such case, the value $h(t_2)$ was not transmitted, so that the curve RC1 only insufficiently replicates the actual curve of the process variable h. The second curve was formed after transmission of the values of the process variable h according to the second approach of the invention for a solution. Since the value $h(t_2)$ was supplementally transmitted, the curve RC2 can sufficiently well display the actual curve of the process variable h.

Figure 7A:
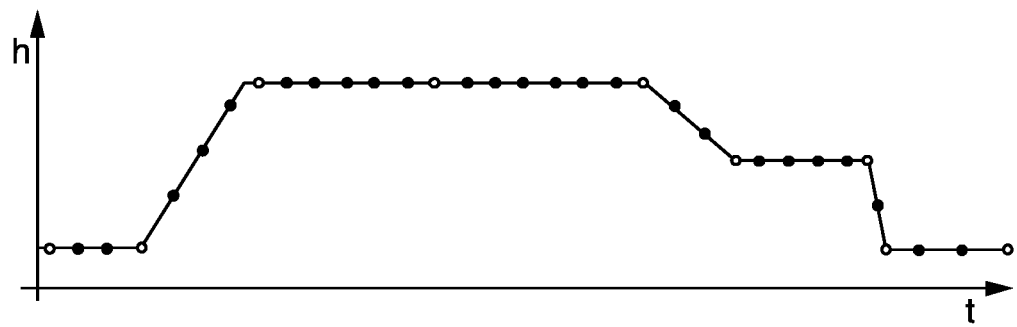
Figure 7B:
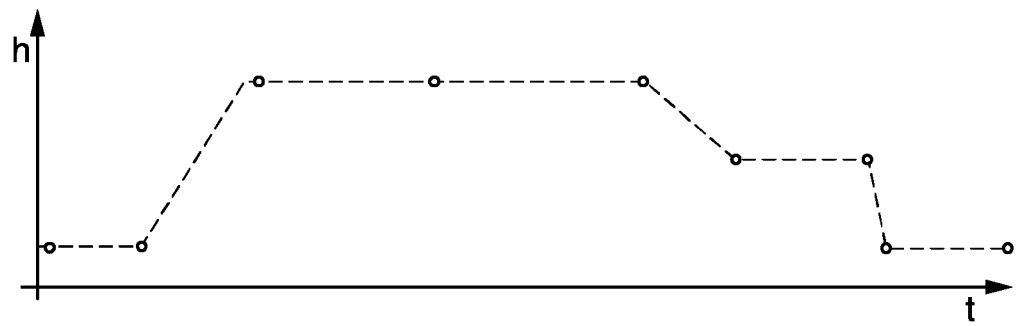

FIGS. 7a and 7b show a transmission of values of the process variable h, which uses a combination of the methods described in FIGS. 4a, 4b, 5a, 5b, 6a, and 6b. In this way, the data transmission can be reduced to an absolute minimum, without essential information being lost.

FIG. 7a shows the real course of the process variable h. At determined points in time, each of which lies spaced from its neighbors by the fixed time interval $\Delta t1$, the wireless adapter WA queries the current value of the process variable h and executes the individual method steps. By applying the provisions of the methods, only those values of the process variable h are transmitted, which are shown with an unfilled circle. The values of the process variable h illustrated with solid circles are not transmitted.

FIG. 7b shows a replicated curve based on the transmitted values. This corresponds to the actual course of FIG. 7a essentially completely.

The method of the invention can be applied for any number of other applications and is not limited to the examples of embodiments illustrated in the figures. Also, any other types of field devices FD can be used, so that the invention relates by no means exclusively to fill level measuring devices.

Furthermore, it can be provided that the field device FD equips the obtained values with a time stamp and stores the values of the process variable provided with the time stamp as historical data. The first magnitude $\Delta h_1$ (see FIGS. 4a and 4b) and/or the second magnitude $\Delta h_2$ (see FIGS. 6a and 6b) and/or the factor (see FIGS. 5a and 5b) are/is determined based on the historical data. Based on a steadily growing history of the field device FD, relevant values optimal for its application can be independently determined, without necessitating input from the user. For comparing the historical values and determining the first magnitude, the second magnitude and/or the factor, for example, an AI (artificial intelligence) algorithm, especially one based on neural networks or deep learning, is used.

The invention claimed is:

1. A method for reducing volume of data to be transmitted from a field device, wherein the field device registers values of a process variable, wherein the field device is connected for communication with a network participant via a communication network, and wherein the field device is embodied to transmit registered values of the process variable to the network participant, the method comprising:
   checking a current value of the process variable at determined points in time that have a constant time difference from neighboring points in time;
   comparing a value of the process variable at a first point in time, which corresponds to the point in time of the checking, with a value of the process variable at a second point in time, wherein the second point in time is the point in time preceding the first point in time; and
   transmitting the value of the process variable at the first point in time when a magnitude of the difference between the value of the process variable at the first point in time and the value of the process variable at the second point in time is greater than or equal to a predetermined first magnitude,
   wherein the value of the process variable at the first point in time is transmitted only when the magnitude of the difference between the value of the process variable at the first point in time and the value of the process variable at the second point in time differs at least by a predetermined factor from a magnitude of a difference between the value of the process variable at the second point in time and a value of the process variable at a third point in time, wherein the third point in time is the point in time preceding the second point in time.

2. The method as claimed in claim 1, wherein when the magnitude of the difference between the value of the process variable at the first point in time and the value of the process variable at the second point in time is greater than or equal to a predetermined second magnitude, wherein the second magnitude is greater than the first magnitude, supplementally, the value of the process variable at the second point in time is transmitted.

3. The method as claimed in claim 2, further comprising:
   transmitting a time stamp with each value of the process variable, wherein each time stamp corresponds to a point in time of the checking.

4. The method as claimed in claim 3, further comprising:
   storing in the field device the time stamp accompanied values of the process variable as historical data, and
   determining in the field device the first magnitude, the second magnitude, and the factor based on the historical data.

5. The method as claimed in claim 1, wherein a wireless network is used as the communication network and wherein the values of the process variable are transmitted wirelessly from the field device to the additional network participant.

* * * * *